US007365485B2

(12) United States Patent
Fukasawa et al.

(10) Patent No.: US 7,365,485 B2
(45) Date of Patent: Apr. 29, 2008

(54) WHITE LIGHT EMITTING DIODE WITH FIRST AND SECOND LED ELEMENTS

(75) Inventors: Koichi Fukasawa, Fujiyoshida (JP); Nodoka Oishi, Fujiyoshida (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 349 days.

(21) Appl. No.: 10/965,177

(22) Filed: Oct. 15, 2004

(65) Prior Publication Data
US 2005/0082974 A1 Apr. 21, 2005

(30) Foreign Application Priority Data
Oct. 17, 2003 (JP) .............................. 2003-358575

(51) Int. Cl.
H01J 1/62 (2006.01)
H01J 63/04 (2006.01)
(52) U.S. Cl. ...................... 313/502; 313/498; 313/506; 313/512
(58) Field of Classification Search ........ 313/498–504, 313/506, 512; 362/84, 231; 257/E33.069, 257/E25.032, E25.02, E25.023
See application file for complete search history.

(56) References Cited
U.S. PATENT DOCUMENTS
6,577,073 B2 * 6/2003 Shimizu et al. .............. 315/246

7,008,078 B2 * 3/2006 Shimizu et al. .............. 362/231
2002/0006040 A1 * 1/2002 Kamada et al. .............. 362/237
2004/0223315 A1 * 11/2004 Suehiro et al. ................ 362/84

FOREIGN PATENT DOCUMENTS
CN        1326230       12/2001
JP        07-015044      1/1995
JP        2927279        5/1999
JP        2002-057376    2/2002
JP        2002-076443 A  3/2002

OTHER PUBLICATIONS
Chinese Office Action with English summary received Aug. 17, 2007.

* cited by examiner

Primary Examiner—Nimeshkumar D. Patel
Assistant Examiner—Kevin Quarterman
(74) Attorney, Agent, or Firm—Browdy and Neimark

(57) ABSTRACT

A white LED (20) for emitting illumination light entirely to exterior, comprising a first LED element (4) and a second LED element (5) which have mutually different emission wavelengths, and a sealing member (10) including a fluorescent material (8) which is excited to emit yellow light (sy) and for sealing at least the first LED element, the first LED element (4) being a long wave length-blue LED element for emitting blue light (sb 1) of a long wave length in which a peak wave length is in the range of 470 nm to 490 nm, the second LED element being a red LED element for emitting red light (sr).

15 Claims, 13 Drawing Sheets cr: Red LED element    cy: Yellow fluorescent material
cb: Blue LED element   cb1: Long wavelength blue LED element

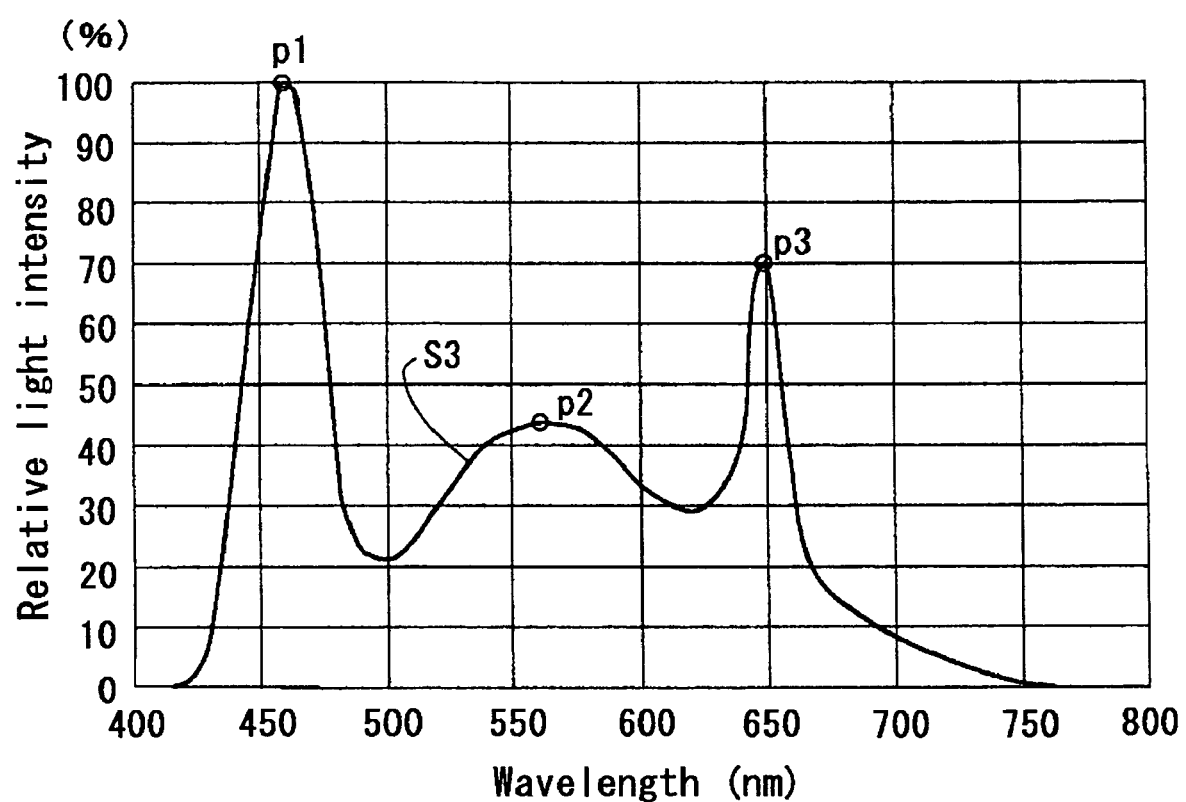

cr: Red LED element    cy: Yellow fluorescent material
cb: Blue LED element    cb1: Long wavelength blue LED element

WHITE LIGHT EMITTING DIODE WITH FIRST AND SECOND LED ELEMENTS

CROSS REFERENCE TO THE RELATED APPLICATION

The application claims the priority benefit of Japanese patent Application No. 2003-358575, filed on Oct. 17, 2003, the entire descriptions of which are incorporated herein by reference.

BACKGROUND OF THE INVENTION

1. Field of the Invention

The present invention relates to a light emitting diode or LED used as a backlight for a liquid crystal display for performing a color display, illumination of a flush for photographing a still or moving picture, the other usual light emitting source for illumination, more specifically to an improvement in a white light emitting diode device (hereinafter, referred to as white LED) capable of emitting white light or light close to the white light.

2. Description of Related Art

Because an LED chip (hereinafter, referred to as LED element) is a semi-conductor element, it has been known that the LED element has a longer operating life and good driving characteristic, is compact, has effective light-emission, and bright light emitting color. Therefore, an LED device (hereinafter, merely referred to as LED) in which the LED element as the semiconductor chip is mounted on a substrate has been used widely as a compact illuminating source.

Recently, from the fact that high efficient LED element for emitting three original color lights of red (R), green (G) and blue (B), respectively has been developed, a multi-color mixing type LED comprising LED elements of R, G and B has been known as shown in a patent document 1, Japanese Patent Laid-Open H. 7-15044 (FIG. 1), in order to emit white light.

However, in the LED comprising a combination of the LED elements, because each LED element, that is to say, each of the R-LED element, the G-LED element and the B-LED element has an excellent monochromatic peak emission wavelength, if it is used for a light emitting source of white color system, there is a problem that the color range of the LED is small and the color of emitted light from the LED is unnatural; in other words, the LED has a poor color rendering property. Herein, "color rendering property" is the property of a light source concerning how an object exhibits its color when the object is illuminated by the light source. If a light from a device has an excellent color rendering property, that means the property of the light is very similar to the property of natural light. Considering the importance of the color rendering properties of illumination devices, the CIE (Commision Internationale de l'Eclairage) has determined an evaluation method for the color rendering property in 1964. According to this method, a series of reference light sources are determined where the reference light sources are selected depending on the color temperature of the light source to be evaluated. The color rendering index Ra is determined from the difference in the color of a predetermined test color between the case when it is illuminated by the reference light sources and in the case when illuminated by the light source to be evaluated. Color rendering index Ra takes a value between 0 and 100.

For example, in case of the LED comprising the combination of the LED elements of R, G and B as described in the patent document 1, an emission spectrum is as shown by S1 in FIG. 7A, a valley of spectrum intensity exists widely between R and G, G and B. In particular, a range of the valley which has 550 nm to 610 nm between R and G is also wide in width, and the decline of the spectrum intensity thereof is drastic.

That is to say, the emission spectrum of the LED is vastly different from a spectrum characteristic of natural light. Therefore, the color rendering property of the LED is poor, and Ra becomes about 12 (in case of the natural light, Ra=100). Meanwhile, when the color rendering property of the LED is poor, it is unsuitable to use the LED as an illumination source in a read-out device such as a scanner device and a photocopier for detecting reflected light on an object or other devices.

Accordingly, to improve the problem, a white LED in which an emission color of light from an LED element is color-converted by a fluorescent material has been developed as shown in Japanese Patent No. 2927279 (FIGS. 1 and 3) (patent document 2).

The structure of the white LED is shown in FIGS. 8A and 8B by modifying it into a structure of a surface-mounted LED for the sake of convenience. In FIGS. 8A and 8B, 110 is a white LED. The white LED 110 is formed by fixing a blue LED element 101 of an INGaN system on an insulative substrate 102 provided with electrode patterns 103 and 104 for connecting, connecting one electrode 101a or p-layer electrode of the blue LED element 101 with the electrode pattern 103 by a wire 106, after connecting the other electrode 101b or n-layer electrode with the electrode pattern 104 by a wire 106, sealing the LED element and the electrodes by a sealing member 107 comprising a resin in which a fluorescent material 108 of an yttrium, aluminum, garnet (YAG)-fluorescent material or the like is dispersed. With such structure, a portion of emitted light sb from the blue LED element 101 having a peak wavelength in the vicinity of 460 nm, for example, is absorbed in the above-mentioned fluorescent material 108 and is converted into light of yellow-green color sy whose peak wavelength is around 560 nm. As a result, an emission spectrum of the white LED 110 includes an emission from the blue LED element 101 having the peak wavelength of 460 nm and an emission from the fluorescent material 108 having the peak wavelength of 560 nm, as shown at S2 in FIG. 7B. As is clear from the above, because the white LED 110 emits in most of the range of visible light, it has an excellent color rendering property and an average color rendering index Ra exceeding 80. Consequently, the problem of the poor color rendering property as in the multi color mixing type LED in the patent document 1 can be partly solved and an improved LED is offered.

However, there is still a problem in the conventional white LED including the blue LED element and the fluorescent material of the YAG or the like as follows.

As is clear from the emission spectrum as shown at S2 in FIG. 7B, in the range particularly exceeding the wavelength of 650 nm of a red range, the intensity of the spectrum declines considerably compared with that of an emission spectrum in the other range of wavelength (visible light). Therefore, this results in lack of repeatability in the red range. For example, if an illuminated object having an object color in the red range is illuminated, the red component of the reflected or transmitted light declines greatly, accordingly the white LED lacks the repeatability of the object color, compared to natural light.

Therefore, for resolving the problem of the above-mentioned conventional fluorescent material-color mixing type white LED, a fluorescent material-color mixing type white LED with red complementary effect, in which the fluorescent material is combined with the blue LED element and a red LED element is further added, has been known as disclosed in Japanese Patent Laid-Open 2002-57376 (patent document 3).

The fluorescent material-color mixing type white LED with red complementary effect emits red and white lights simultaneously by adding the red LED element to the conventional fluorescent material-color mixing type white LED as shown at numeral 110 in FIGS. 8A and 8B. FIG. 9 illustrates an emission spectrum S3 of the conventional fluorescent material-color mixing type white LED with red complementary effect. In FIG. 9, there exist a peak p1 with great intensity in the vicinity of 450 nm which is a component of blue light, a peak p2 in the vicinity of 560 nm which is a component of yellow light, and a large peak p3 in the vicinity of 650 nm which is a component of red light emitted from the red LED element. In other words, in the fluorescent material-color mixing type white LED with red complementary effect, the spectrum, particularly, in the red range of visible light is reinforced, the repeatability in the red range is improved.

In the fluorescent material-color mixing type white LED with red complementary effect as shown in the patent document 3, the color rendering property and the repeatability in the red range are considerably improved in comparison with the R-G-B mixing type white LED (in patent document 1) and the fluorescent material-color mixing type white LED (in the patent document 2).

However, the color rendering property is not sufficient when using the white LED for a backlight of a full color display as a white light source, in particular, an emission component in the vicinity of 500 nm in a green area is insufficient as shown in the spectrum S3 in FIG. 9.

Moreover, if the white LED is used as illumination light in place of a fluorescent bulb, there is a problem that it becomes unnatural illumination that red glares, and it is not possible to substitute it for the fluorescent bulb as natural illuminating light.

This point will be described using a chromaticity diagram shown in FIG. 10.

In FIG. 10, chromaticity points of red emission of the red LED element, yellow emission of the fluorescent material and blue emission of the blue LED element (typical one, for example, in the range of 450 nm to 470 nm), in the fluorescent material-color mixing type white LED with red complementary effect are represented at cr, cy and cb, respectively. These chromaticity points are regarded to be located adjacent to a locus ST of monochromatic light. Now, when the red light is not energized and only the blue LED element is energized, the chromaticity of the white LED follows on a straight line L combining the points, cy and cb according to a percentage of the blue emission and the yellow emission (and fluorescent light), while the straight line L passes a chromaticity point c0 of white color or the vicinity thereof. Here, even if the white LED is intended to target white color, when the red LED element is energized to increase the repeatability of the red range, all the chromaticity points are moved toward the point cr as shown by arrow F, x coordinate of the chromaticity increases so as to be recognized in a state tinged with red.

Furthermore, otherwise, there is a problem that the red color light is recognized as a point like state, as viewed from above because a mixture of the red color light and the other color light is insufficient and is not achieved evenly.

SUMMARY OF THE INVENTION

The present invention has been made in view of the above-mentioned problems, an object thereof is to provide a white LED capable of substituting for a fluorescent bulb as a backlight of a color display or natural-colored illuminating light.

To achieve the above object, a white LED in an aspect of the present invention comprises a first LED element and a second LED element, which have mutually different emission wavelengths, and a sealing member including a fluorescent material which is excited to emit yellow light and sealing at least one LED element which is the first LED element being a long wavelength-blue LED element for emitting blue light of a long wavelength, the second LED element being a red LED element for emitting red light.

In one embodiment, a peak wavelength of the blue LED of the long wavelength which is the first LED element is in the range of 470 nm to 490 nm.

Moreover, the first and second LED elements are electrically connected with corresponding terminals, respectively, and energization of the blue LED which is the first LED and the red LED which is the second LED are separately controlled.

Furthermore, the second LED element comprises one red LED element, and the first LED element comprises a plurality of blue LED elements each having a long wavelength. Each of the plurality of long wavelength-blue LED elements is electrically connected with a separate terminal and energization thereof is separately controlled.

BRIEF DESCRIPTION OF THE DRAWINGS

FIG. 9 is a view showing an emission spectrum of a conventional improved white LED.

DETAILED DESCRIPTION OF THE PREFERRED EMBODIMENTS

Figure 1A:
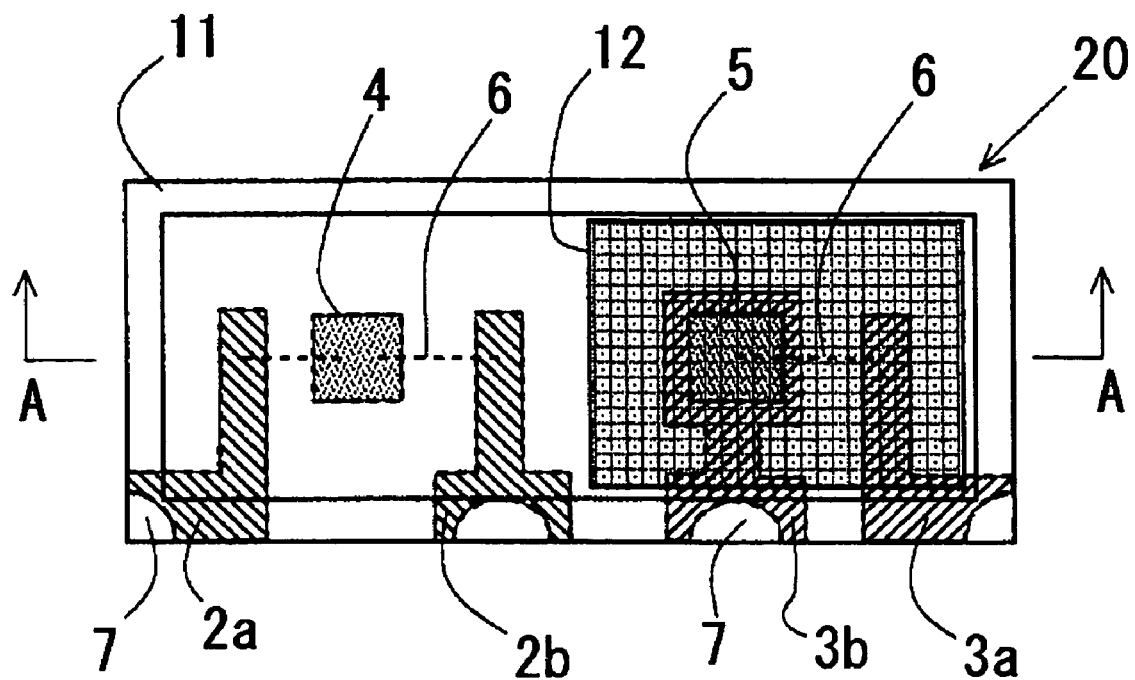
FIG. 1A is a top view of a white LED according to a first embodiment of the present invention.
Figure 1B:
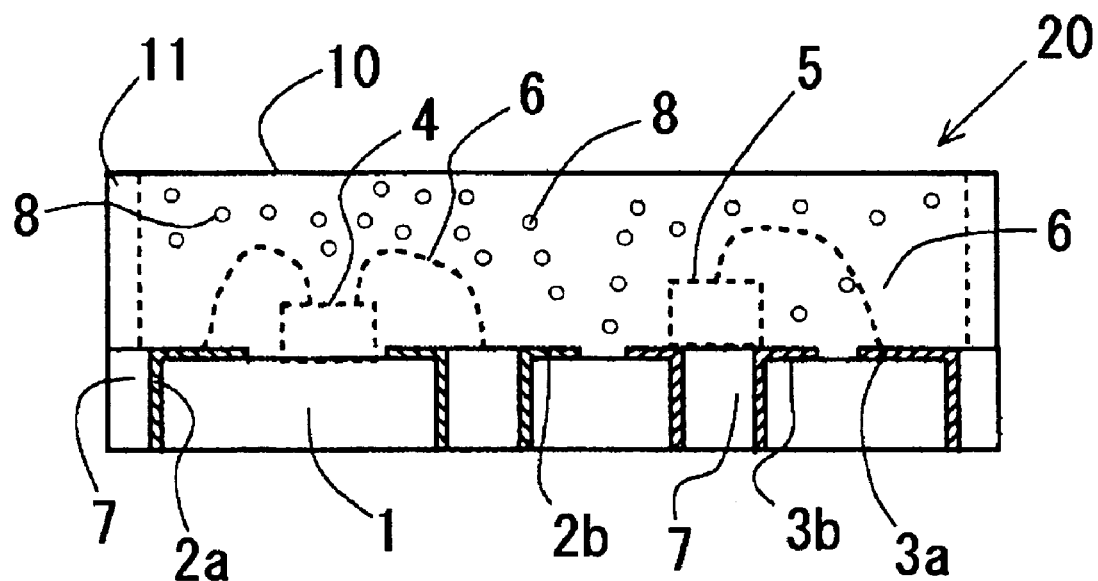
FIG. 1B is a front view of the white LED according to the first embodiment of the present invention.

Hereinafter, several embodiments of the present invention are described in detail with reference to the accompanying drawings.

A white LED according to a first embodiment of the present invention is first explained.

FIGS. 1A to 1D illustrate the structure of the white LED 20 in the first embodiment. The white LED 20 comprises a surface-mounted LED, which belongs to a fluorescent material-color mixing type LED with red complementary effect, which is targeted to emit white light. In FIGS. 1A to 1D, reference numeral 1 is an insulative board having a generally rectangular shape and made of epoxy resin and so on including glass fibers, 2a and 2b a pair of connecting electrodes for a blue LED element 4, 3a and 3b a pair of connecting electrodes for a red LED element 5, four through-holes 7 formed on a side surface of the board 1, for example.

The connecting electrodes 2a and 2b for the blue LED element 4 and the connecting electrodes 3a and 3b for the red LED element 5 are patterned on an upper surface of the board 1 and extend to inner surfaces of the through-holes 7 corresponding to the connecting electrodes, respectively. The blue LED element 4 emits blue light whose peak wavelength λd has a range of 470 nm to 490 nm, and the red LED element 5 emits red light whose peak wavelength λd has a range of 620 nm to 660 nm.

Figure 1C:
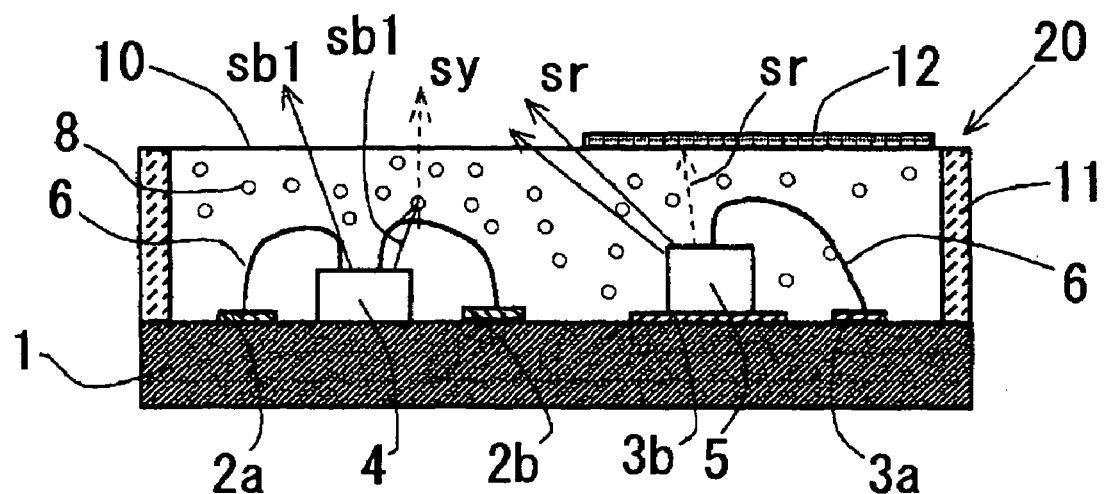
FIG. 1C is a sectional view taken along A-A line in FIG. 1A.
Figure 1D:
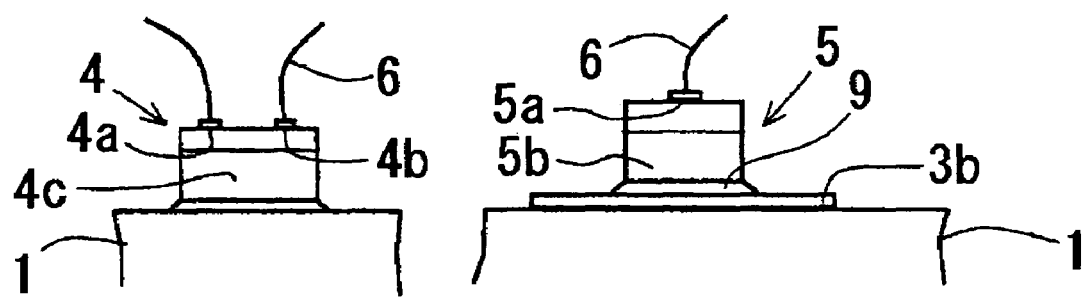
FIG. 1D is an elevational view showing a portion of an LED element.

As shown in FIG. 1D, the long wavelength-blue LED element 4 has a sapphire insulative base 4c, and a p-n semiconductor layer of a GaN system formed on the sapphire insulative base 4c. More specifically, the sapphire insulative base 4c is adheshively fixed directly on the board 1, and an n-layer electrode 4b of the long wavelength-blue LED element 4 is connected with the connecting electrode 2b for the blue LED element 4 by a wire 6 and a p-layer electrode 4a of the long wave length-blue LED element 4 is connected with the connecting electrode 2a for the blue LED element 4 by another wire 6 (see FIG. 1C).

On the other hand, when the LED is inexpensively produced, the red LED element 5 having a p-n connecting type may be formed by GaAlAs, for example, and when capability of the LED is emphasized, the red LED element 5 having a p-n connecting type may be formed by GaAlInP, for example. An n-layer electrode 5b of the red LED element 5 is connected with the connecting electrode 3b for the red LED element 5 through a silver paste 9 and a p-layer electrode 5a is connected with the connecting electrode 3a for the red LED element 5 through a wire 6.

In this way, the long wavelength-blue LED element 4 and the red LED element 5 mounted and connected on the board 1 are sealed by a sealing resinous member 10, in which a YAG fluorescent material 8 is mixed and dispersed in a transparent molded resin being molded and covering upper surfaces and side surfaces of the LED elements.

Here, numeral 11 is a resinous frame, which is disposed to surround the sealing resinous member 10 on the board 1. The resinous frame 11 acts to define a configuration of the sealing resinous member 10 and to prevent the melting mold resin from flowing out to a back surface or the through-holes of the board 1, when the sealing resinous member 10 is formed as described above.

Numeral 12 is a light shielding coat for shielding light, which is formed to cover above the red LED element 5 on an upper surface of the sealing resinous member 10. With the light-shielding coat, red light sr emitted from the red LED element 5 is prevented from being recognized directly as a point-like red light from above the white LED.

As described above, the surface-mounted white LED 20 in the first embodiment is structured.

The connecting electrodes 2a, 2b and 3a, 3b for the blue and red LED elements in the white LED 20 are connected with corresponding wirings (not shown) on a circuit substrate or a motherboard (not shown), through the corresponding through-holes 7, and the LED elements of the white LED emit light simultaneously by applying a positive voltage in a direction from the connecting electrode 2a for the blue LED element 4 to the connecting electrode 2b for the blue LED element 4, a positive voltage in a direction from the connecting electrode 3a for the red LED element 5 to the connecting electrode 3b for the red LED element 5, and thus by passing a required electric current through each of the long wave length-blue LED element 4 and the red LED element 5. As one example thereof, the long wavelength-blue LED element 4 emits a long wavelength-blue light sb1 having a peak wavelength in the range of 470 nm to 490 nm, the red LED element 5 emits a red light sr having a peak wavelength in the range of 620 nm to 660 nm, as shown in FIG. 1C. In this case, a portion of the long wavelength-blue light sb1 is absorbed into the fluorescent material 8 dispersed in the sealing resinous member 10 and excited to emit a yellow light sy in which a peak wavelength is in the vicinity of 560 nm. In addition, the red light sr cannot be transmitted at an above area of the red LED element 5 under the existence of the light shielding coat 12, is emitted obliquely in a state mixed with the long wavelength-blue light sb1 and the yellow light sy, therefore the red light cannot be seen independently as a point-like red light from above.

YAG may be used as a fluorescent material 8.

Figure 5A:
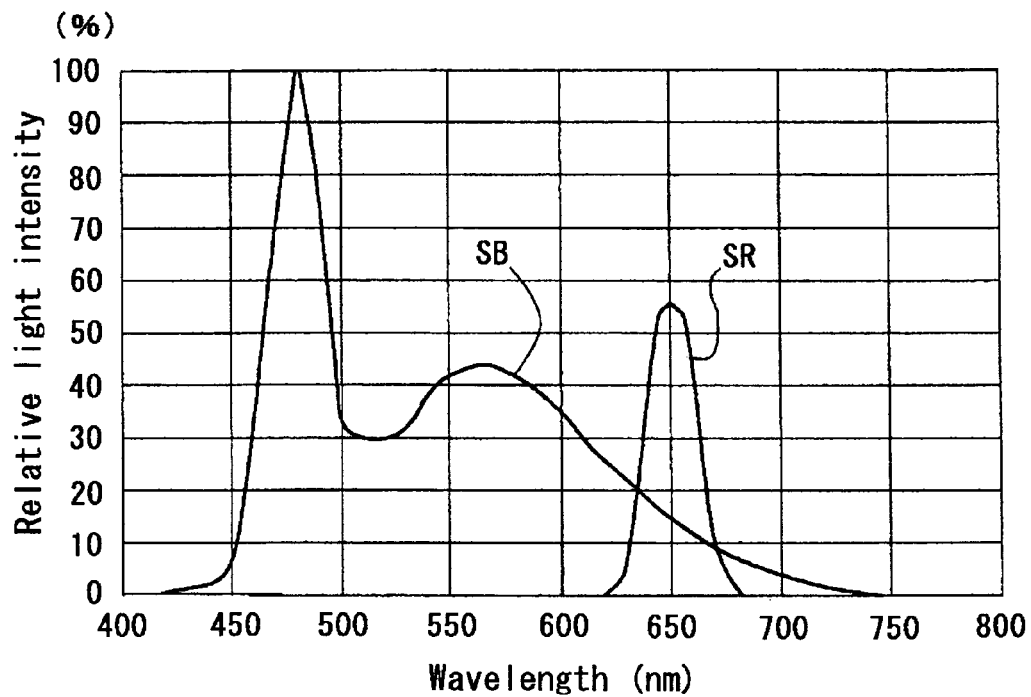
FIG. 5A and FIG. 5B are views showing an emission spectrum of the white LED shown in FIG. 1A.

FIG. 5A is a view showing separately an emission spectrum SB of the combined blue-yellow light of the long wavelength-blue light sb1 and the yellow light sy in the fluorescent material 8, of the light generated as described above and emitted to the exterior through sealing resinous member 10, and an emission spectrum SR of the red light sr.

Figure 5B:
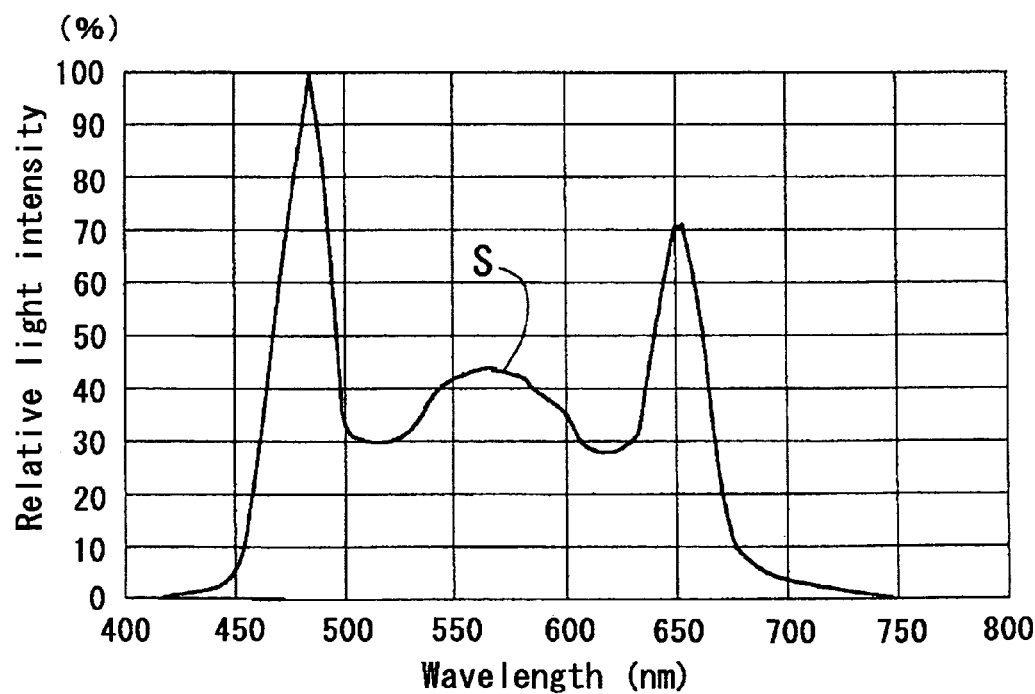

FIG. 5B is a view showing a spectrum S of illumination light s in which components of the red, blue and yellow lights are generalized and emitted outwardly from the white LED 20 as a whole. As shown in FIG. 5B, drop of component for emitting light in the vicinity of 500 nm in a range of green the spectrum is lesser compared with the spectrum S of the white LED with a spectrum shown at S3 in FIG. 9 as a spectrum of comprehensive illumination light of a conventional fluorescent material-color mixing type LED with red complementary effect, and color rendering property of the white LED in the green range can be improved.

Accordingly, the white LED 20 in the first embodiment is appropriate for illumination of a white color system for illuminating a color display such as a color LCD or the like.

Figure 6:
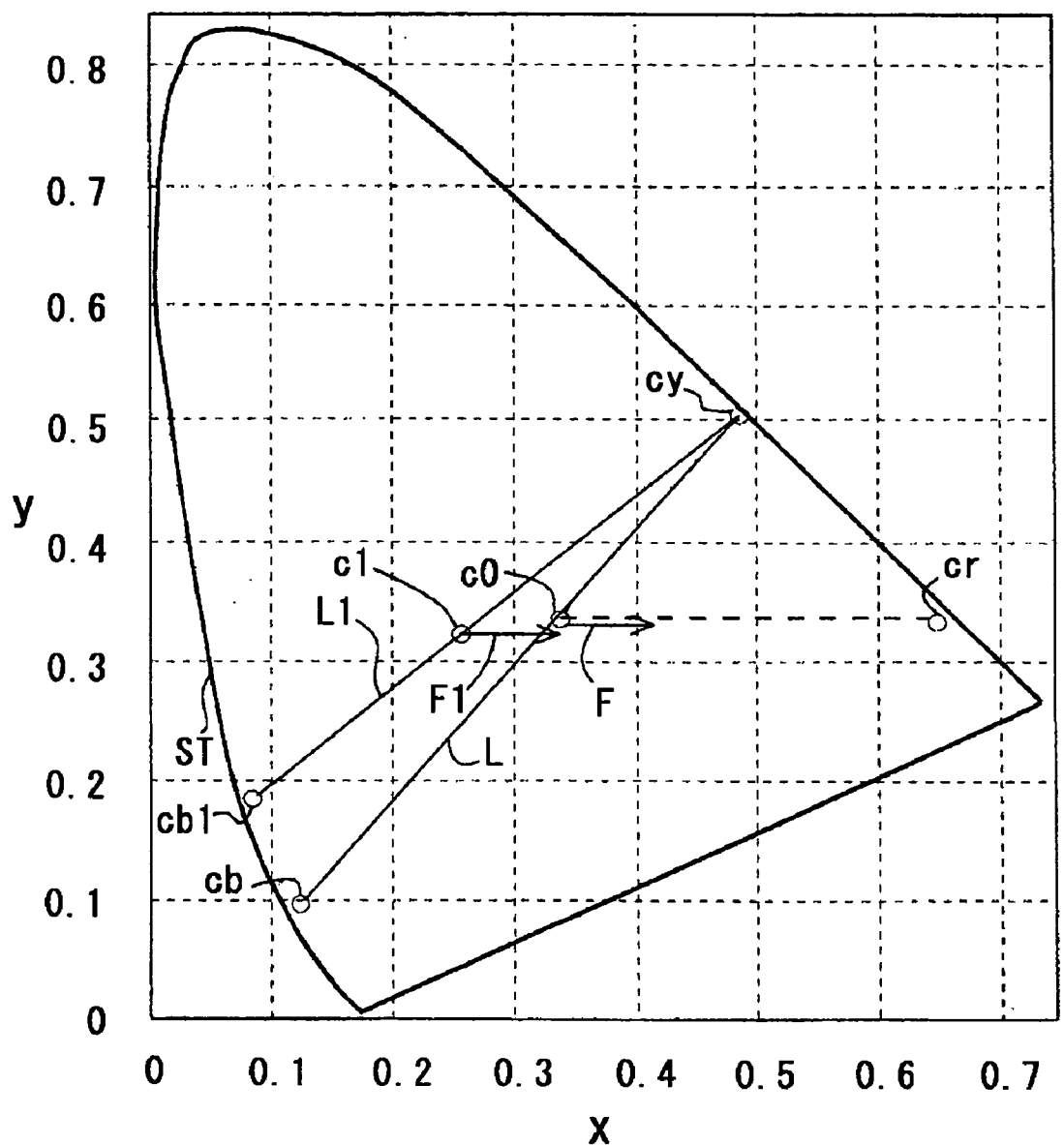
FIG. 6 is a chromaticity diagram showing chromaticity of emission of the white LED shown in FIG. 1A.
Figure 7A:
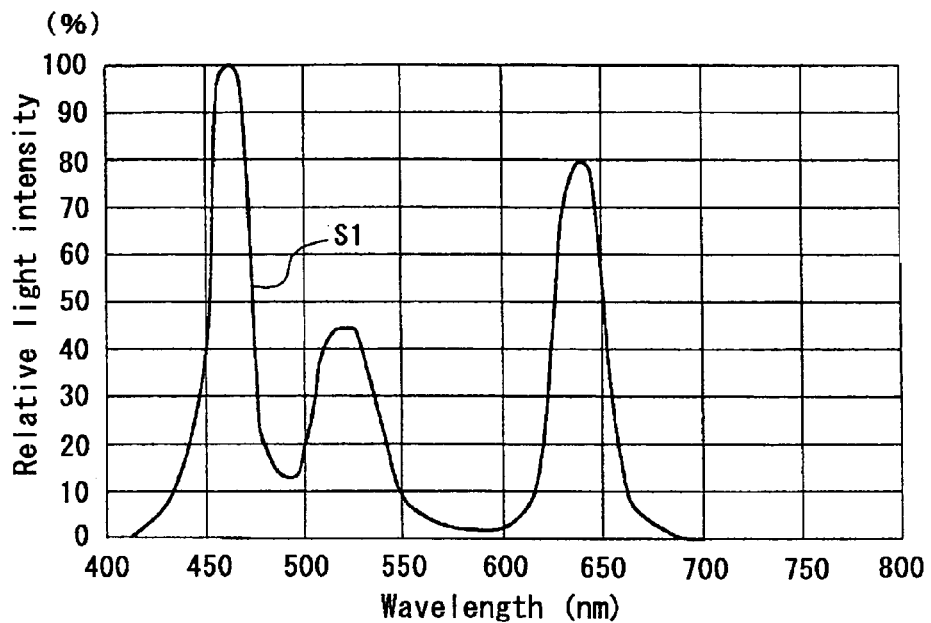
FIG. 7A and FIG. 7B are views showing an emission spectrum of a conventional white LED.
Figure 7B:
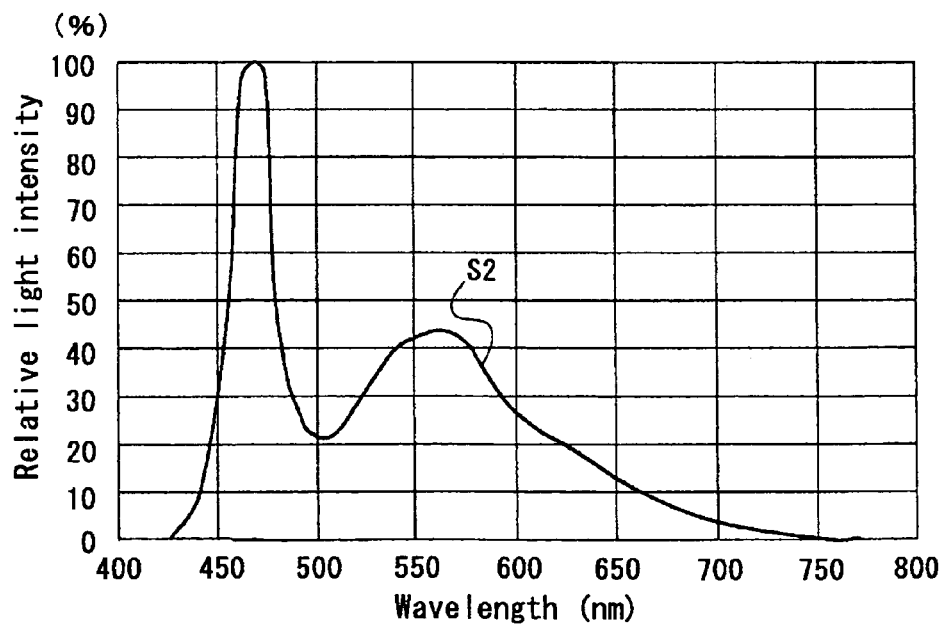
Figure 8A:
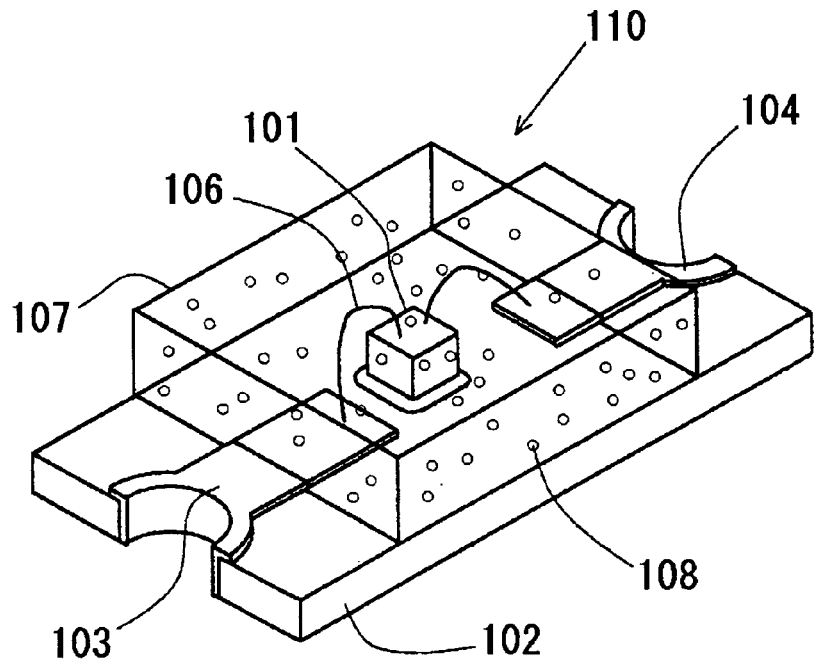
FIG. 8A and FIG. 8B are views showing a structure and an operation of the conventional white LED.
Figure 8B:
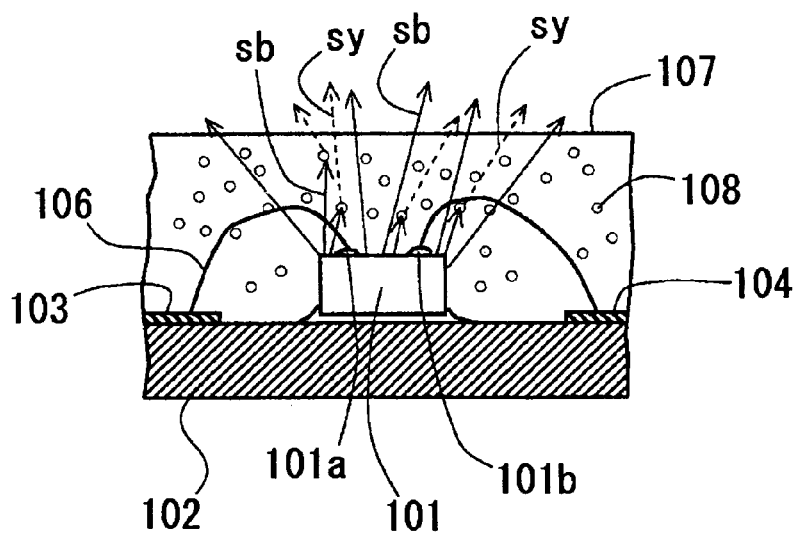
Figure 10:
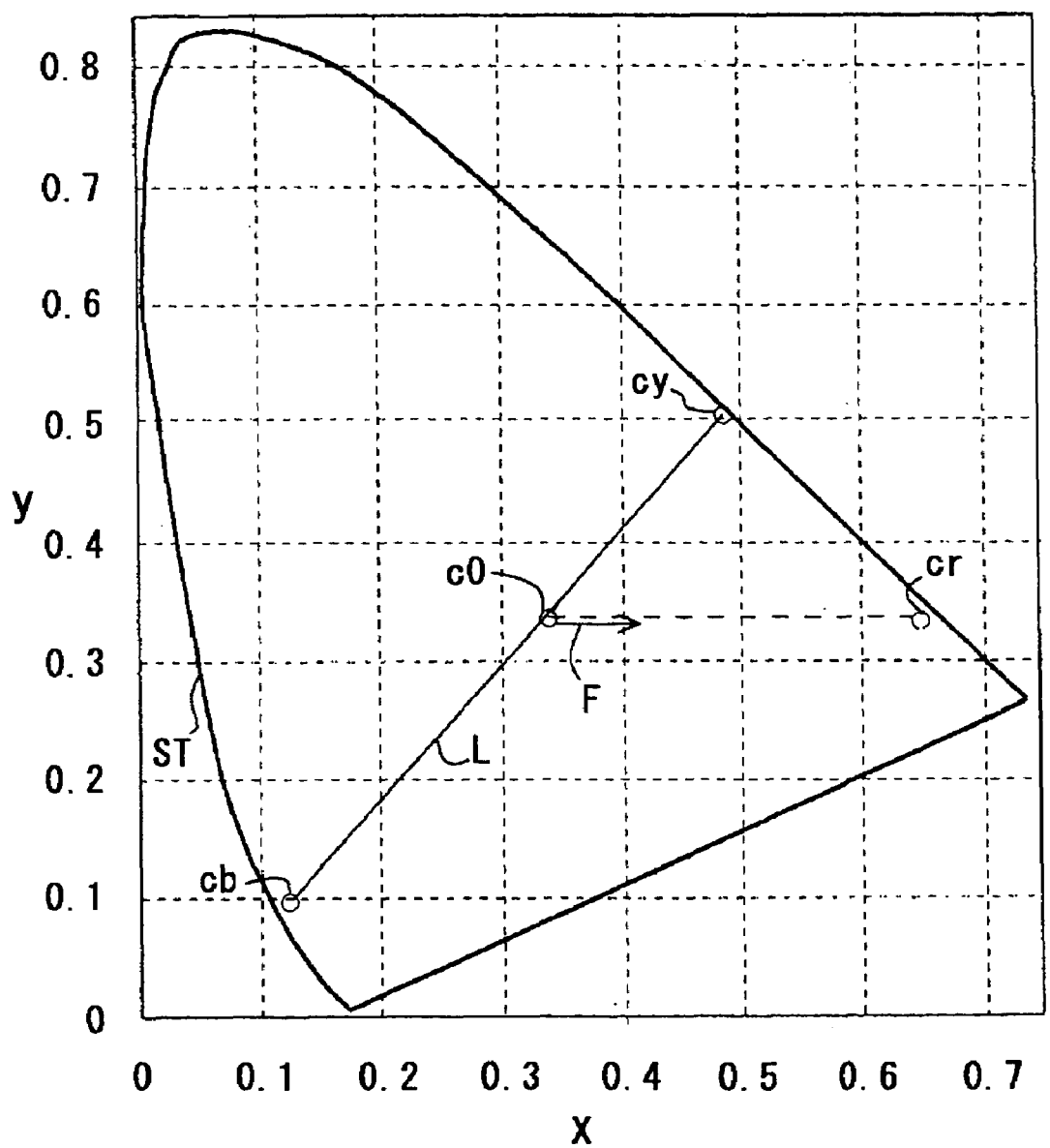
FIG. 10 is a chromaticity diagram showing chromaticity corresponding to the emission spectrum shown in FIG. 9.

FIG. 6 is a chromaticity diagram showing a comparison of chromaticity emitted from the white LED 20 according to the first embodiment with chromaticity emitted from the fluorescent material-color mixing type LED with the conventional red complementary effect as shown in FIG. 10. Here, assuming that a chromaticity point of emission or luminescence (650 nm) of the red LED element 5 is cr, a chromaticity point of emission (560 nm) of the fluorescent material 8 is cy, a chromaticity point of emission (typical one of 470 nm to 590 nm) of the long wavelength-blue LED element 5 is b1, and a chromaticity point of emission (typical one of 450 nm to 470 nm) of the conventional blue LED element is cb, and considering that each of these points exists in the vicinity of a curve line ST showing single light in the chromaticity diagram, the following is described.

Now, if energization is applied to only the conventional blue LED element without energizing the red LED element (650 nm), the entire chromaticity of the LED moves on a straight line L combining the chromaticity point cb of the blue LED and the chromaticity point cy of the fluorescent material according to the proportion of light intensity emitted from the blue LED element and the intensity of the emission from the fluorescent material. The straight line L passes a position in the vicinity of a white chromaticity point c0 (x=0.33, y=0.33). This is, originally, because it is intended to obtain white light of the fluorescent material by combining the emission of the blue LED element and the emission from the fluorescent material. Therefore, in addition to this, when the red LED element emits red light, even if the chromaticity of the combined light is intended to form into white light, as the conventional art already described in FIG. 10, it shifts to a right side of the white light to increase an x-component of the chromaticity, hence the chromaticity of the combined light becomes necessarily a color tinged with red. Therefore the white light is insufficient to illuminate light close to natural light.

On the contrary, the long wavelength-blue LED element 5 (480 nm) is used in place of the conventional blue LED in the first embodiment, a chromaticity point cb1 thereof deviates at a left and above point in x and y directions from the conventional chromaticity point cb, as viewed in FIG. 6. As a result, a straight line L1 combining the chromaticity point cb1 and the chromaticity point cy of the fluorescent material deviates leftward from the above-mentioned straight line L and passes at a left side from the white chromaticity point c0. Consequently, the white chromaticity point c0 is adjusted to become, a left point of the chromaticity point c0, for example, a point c1 by adjusting a proportion of an emission intensity of the long wavelength-blue LED element 4 and an emission intensity of the fluorescent material 8 without lighting the red LED element 5. The adjustment can be achieved by changing a contained amount of the fluorescent material 8 or the emission intensity of the long wavelength-blue LED element 5.

In this state, if the red LED element 5 is energized, the chromaticity of the combined light approaches to the white chromaticity point c0, as shown at the arrow F1 in FIG. 6. In this way, according to the first embodiment, even if the red LED element 5 is energized strongly to some extent, because the entire chromaticity of the combined light can be maintained in a state close to white color, it is prevented from becoming illumination light tinged with red, when using as illumination light close to natural light, in place of a fluorescent bulb.

In addition, in the first embodiment, because the connecting electrodes 2a, 2b and 3a, 3b, which are separate connecting terminals for the long wavelength-blue LED element 4 and the red LED element 5, and they pass desired currents individually through the electrodes of the corresponding separate through-holes 7 as terminals so that the emission intensities of the long wavelength-blue light and the red light can be separately adjusted, the color rendering property (particularly a green range) is improved, the repeatability of a red range is improved for any purpose, and adjustment for reducing red color as white illumination light can be simplified. Moreover, by forming the through-holes into the electrode terminals, even if the terminals are separately provided for the plurality of LED elements in this way, a compact white LED suitable for a surface mounting can be formed. Meanwhile, a minus side electrode (not shown) of the connecting electrodes corresponding to each LED element is formed into a common connecting electrode, if necessary.

In addition, in the LED according to the present invention, because the long wavelength-blue LED element may be structurally substituted for the blue LED element of the fluorescent material mixing color type LED (patent document 3) with red complementary effect in the conventional art, the LED according to the present invention has a same advantageous effect as in the conventional art, without complicating the conventional structure in particular.

Next, a white LED according to a second embodiment of the present invention will be described.

Figure 2A:
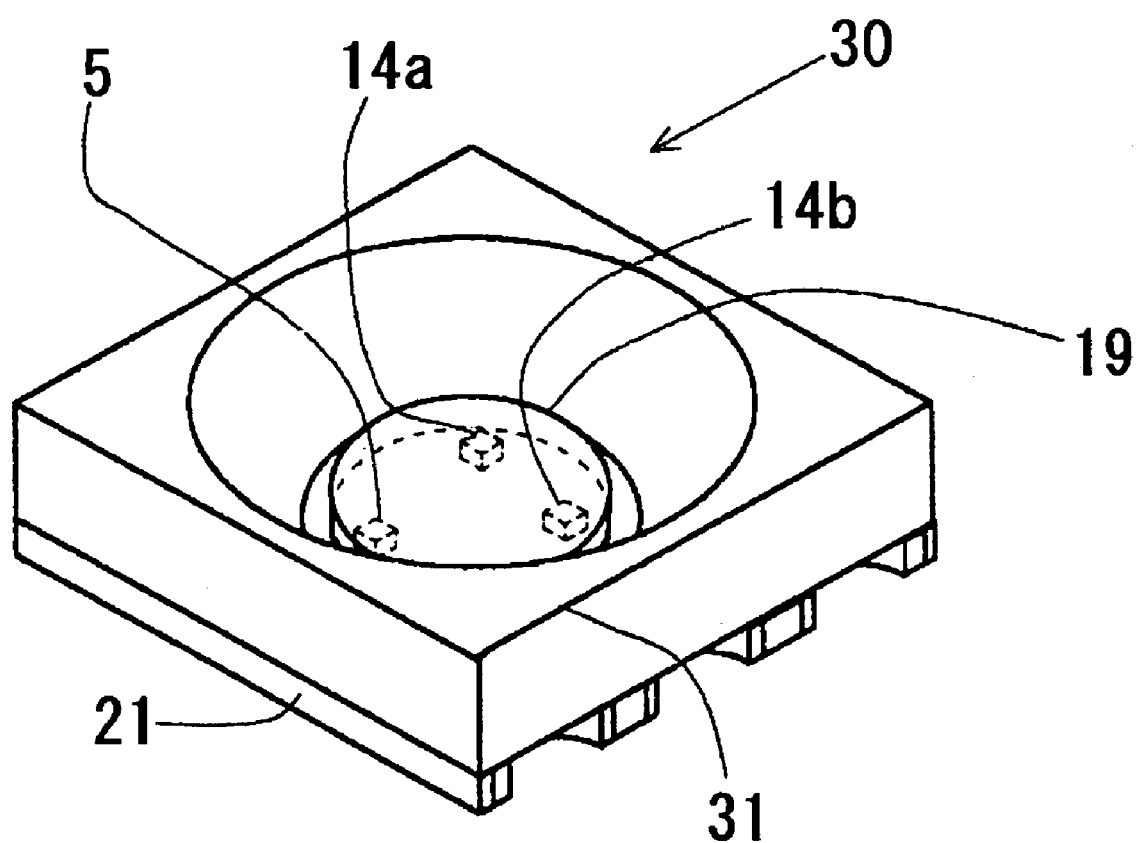
FIG. 2A is a perspective view showing the structure of a white LED according to a second embodiment of the present invention.
Figure 2B:
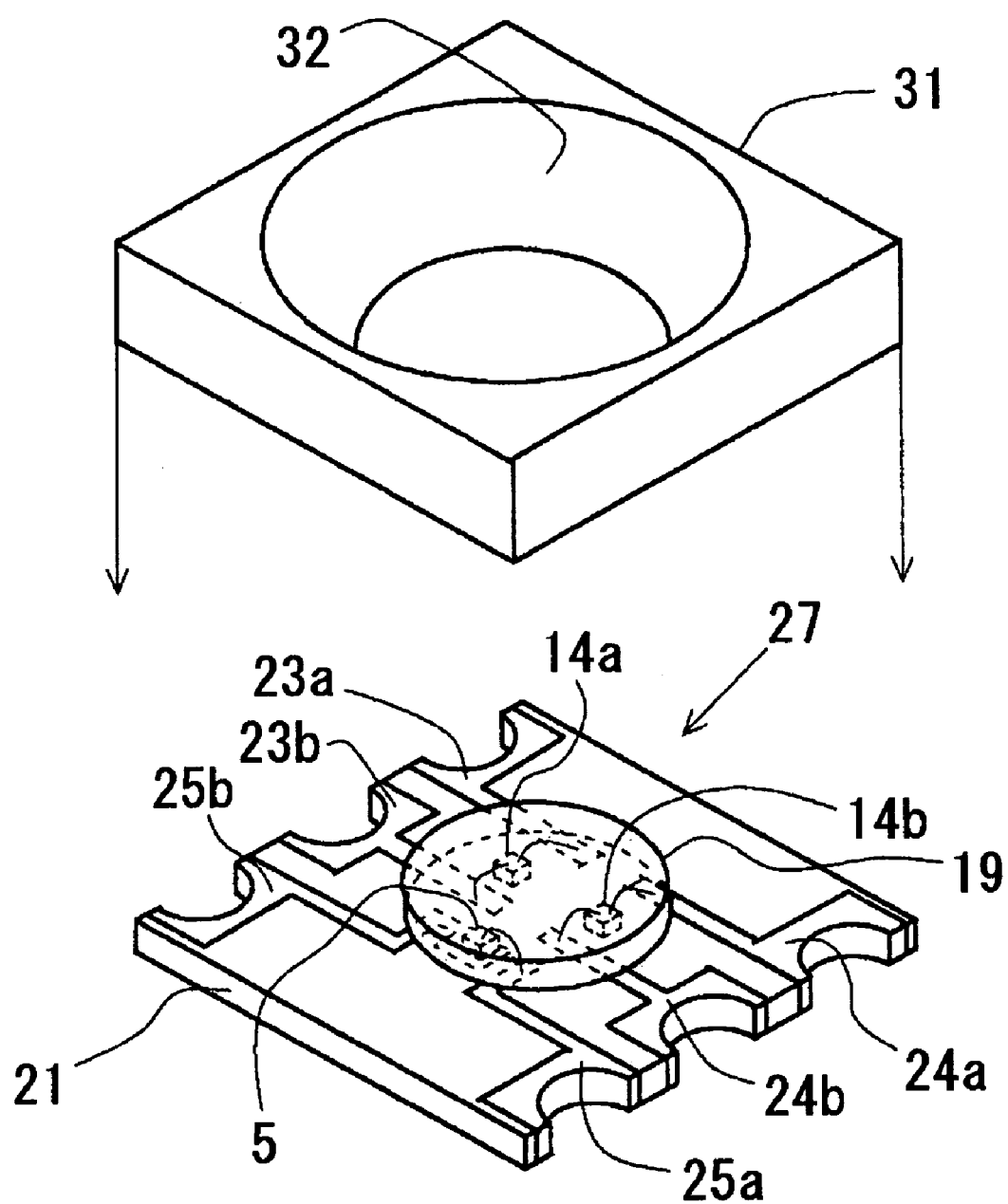
FIG. 2B is an exploded perspective view of FIG. 2A.

FIGS. 2A and 2B illustrate the entire structure of the white LED 30 according to the second embodiment of the present invention. In FIG. 2B, 27 is a white light emitting body in which a red LED element 5, a first long wavelength-blue LED element 14a and a second long wavelength-blue LED element 14b, which are mounted on a substrate 21, are sealed by a sealing resinous member 19 containing a fluorescent material, and 31 a reflecting frame. The white LED element 30 has a structure of attaching the reflecting frame 32 to the substrate 21 of the white light emitting body 31, as shown in FIG. 2A.

Figure 3A:
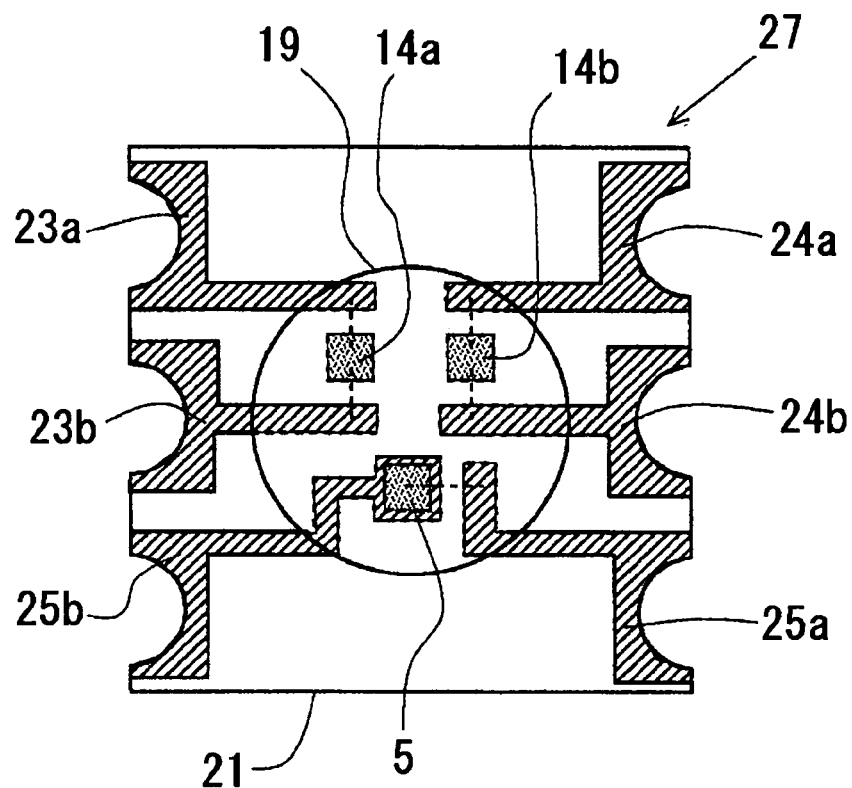
FIG. 3A is a top view of a white light emitting body shown in FIG. 2B.

As shown in FIGS. 2B and 3A, opposed side surfaces of the substrate 21 are formed with six through-holes, first blue-connecting electrodes 23a and 23b, second blue-connecting electrodes 24a and 24b, and red-connecting electrodes 25a and 25b are formed on an upper surface of the substrate 21 and are extended to inner surfaces of the corresponding through-holes. The first long wavelength-blue LED element 14a is fixed to the substrate 21, similarly as shown in FIG. 1D and explained, and connected with the first blue-connecting electrodes 23a and 23b by wires, respectively. The second long wavelength-blue LED element 14b is also fixed to the substrate 21 similarly and connected with second blue connecting electrodes 24a and 24b by wires, respectively. The red LED 5 is conductively fixed to the red-connecting electrode 25b, similarly as shown in FIG. 1D and explained, and connected with the red-connecting electrode 25a by a wire.

Figure 3B:
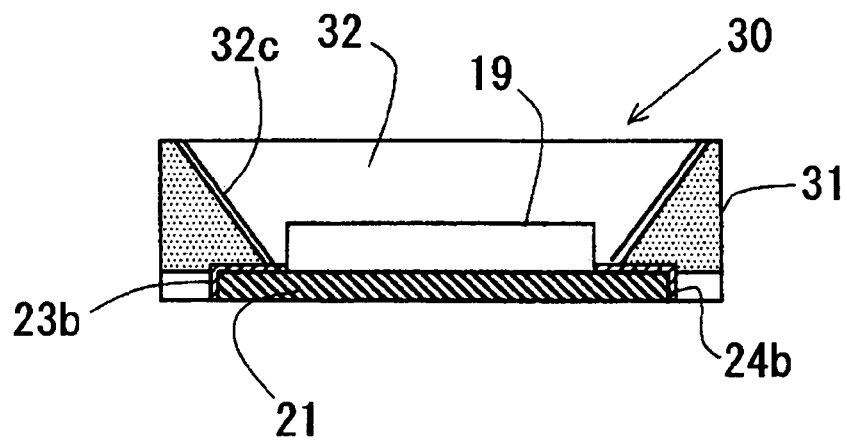
FIG. 3B is a sectional view showing an assembly of the white light emitting body and a reflecting frame.

In this way, the red LED element 5, and the first and second long wavelength-blue LED elements 14a and 14b, which are mounted on the substrate 21 and connected with the required terminals, are sealed by the sealing resinous member 19 containing a YAG fluorescent material (not shown). The sealing resinous member 19 is molded into a generally circular plated shape. In this way, the white light emitting body 27 is formed. The reflecting frame 31 has a shape including a cone-shaped concave portion 32 which passes through to expose a central portion of the substrate 21 when the reflecting frame 31 is mounted on the substrate 21, which has approximately a cuboid shape and formed by a resin or the like, as shown in FIG. 2B. A reflecting coat 32c is provided on a surface of the concave portion 32 by plating or vapor deposition, and so on so as to form a reflecting surface, as shown in FIG. 3B. The reflecting frame 31 is mounted on the substrate 21 at a position where the concave portion 32 which passes through surrounds the sealing resinous member 19, and fixed on the substrate 21 by an adhesive, thermo-compression, or supersonic welding. FIG. 3B illustrates a state in which the substrate 21 and the reflecting frame 31 are fixed.

In the second embodiment shown in FIGS. 2A to 3B, the first and second long wavelength-blue LED elements 14a and 14b have emission wavelengths in the range of 470 nm to 490 nm, together. If the emission wavelengths are in the above range, it is not required that the red emission wavelengths are coincided. A basic principle of the second embodiment is basically common to that of the first embodiment shown in FIGS. 1A to 1D, therefore a description of a common principle is omitted.

In the second embodiment, the reason for using the two long wavelength-blue LED elements 14a and 14b per one red LED element 5 is that increasing the emission intensity of the red LED element to some extent to increase the repeatability of the red range is required, whereas the emission intensity of the long wavelength-blue LED elements is needed to increase by an amount deviated from pure blue than as in the white illumination using the conventional blue LED element, to emit light close to natural light, which is not tinged with red as white light. Moreover, by using the two long wavelength-blue LED elements in this way, all illuminating brightness of the white LED can be increased, while the white color is maintained without lowering the emission intensity from the red LED element. Furthermore, in the second embodiment, by using the reflecting frame 31, it reflects light radiated from the white light emitting body 27 which is a main body of the white LED 30 and irradiates efficiently to an illuminated object, to allow a substantial brightness of the illumination light to increase.

In addition, as a secondary effect, in long wavelength-blue LED elements produced to have the emission wavelength of 480 nm, if the emission wavelength is uneven, it is also possible to correct color rendering property in a green range to a desired value by combining an element having an emission wavelength less than 480 nm and an element having an emission wavelength more than 480 nm as the long wavelength-blue LED elements 14a and 14b and adjusting adequately the emission intensity.

Next, a white LED according to a third embodiment of the present invention will be explained.

Figure 4A:
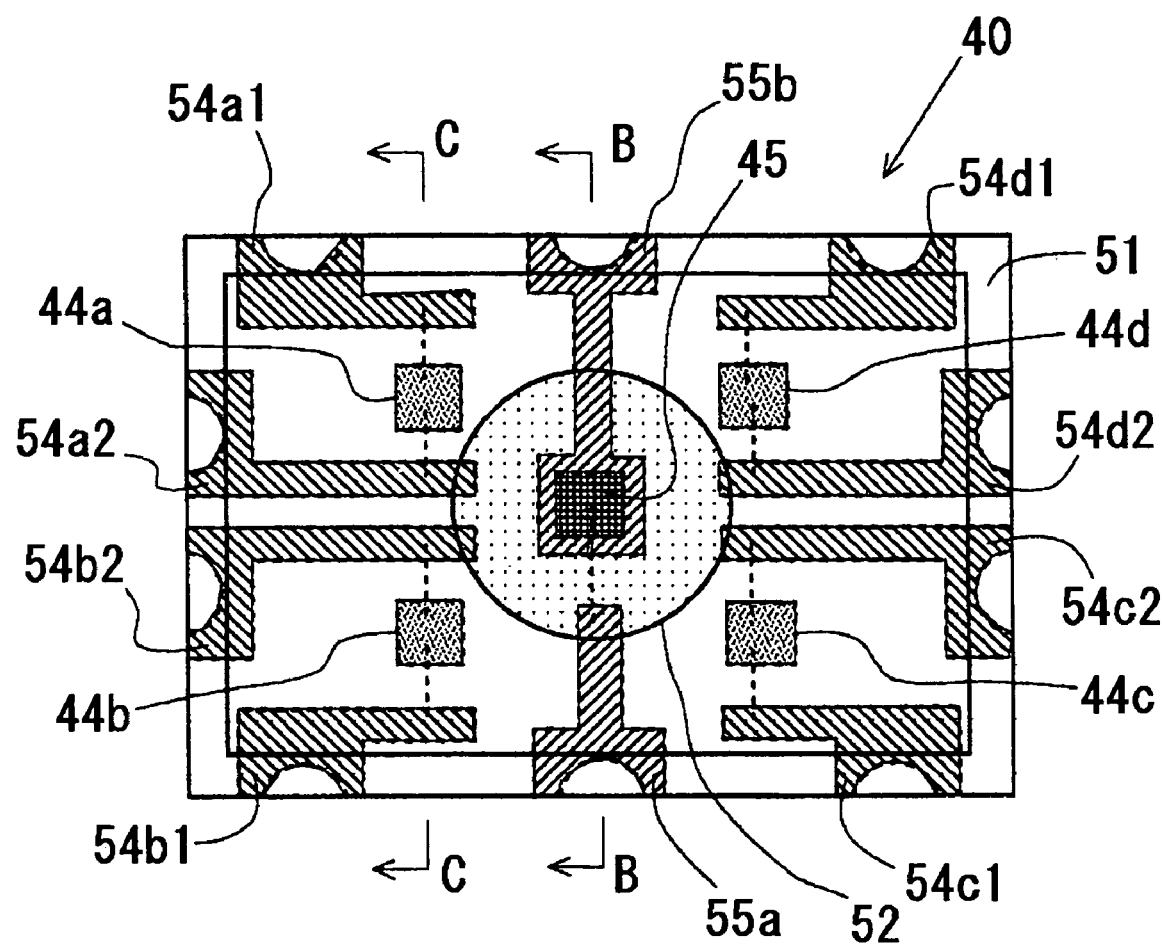
FIG. 4A is a top view showing a structure of a white LED according to a third embodiment of the present invention.
Figure 4B:
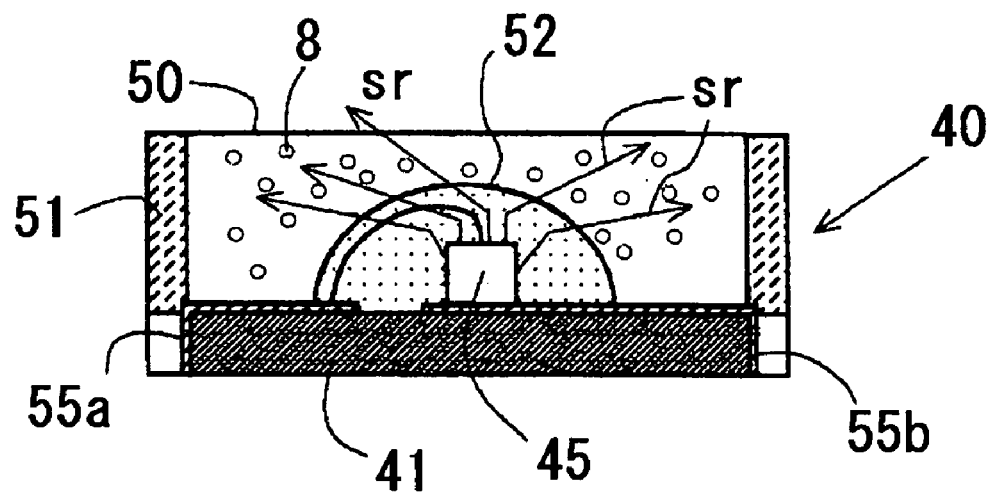
FIG. 4B is a sectional view taken along B-B line in FIG. 4A.
Figure 4C:
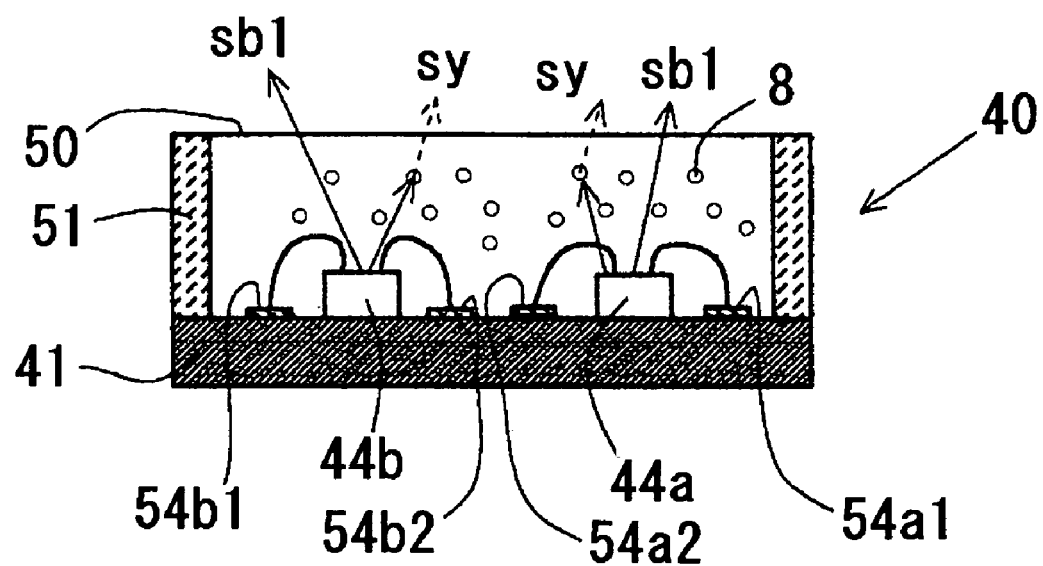
FIG. 4C is a sectional view taken along C-C line in FIG. 4A.

FIG. 4A to 4C illustrate a structure of the white LED 40 according to the third embodiment of the present invention.

In FIGS. 4A to 4C, 41 is a substrate, 45 a red LED element, 44a, 44b, 44c and 44d are long wavelength-blue LED elements. An emission intensity from the red LED element 45 is approximately 650 nm, and emission intensities from the long wavelength-blue LED elements 44a, 44b, 44c and 44d are in the range of 470 nm to 490 nm. 55a and 55b are red-connecting electrodes, 54a1 and 54a2 a pair of connecting electrodes corresponding to the long wavelength-blue LED element 44a, 54b1 and 54b2 a pair of connecting electrodes corresponding to the long wavelength-blue LED element 44b, 54c1 and 54c2 a pair of connecting electrodes corresponding to the long wavelength-blue LED element 44c, and 54d1 and 54d2 a pair of connecting electrodes corresponding to the long wavelength-blue LED element 44d.

As shown in FIGS. 4A and 4B, the red LED element 45 is fixed on and conducted by the one red-connecting electrode 55b in a central portion of the substrate 41, and connected with the other red-connecting electrode 55a by a wire. The long wavelength-blue LED elements 44a, 44b, 44c and 44d are fixed on the substrate 41 at a position surrounding the red LED element 45 as shown in FIGS. 4A and 4B, and the long wavelength-blue LED element 44a is connected with the connecting electrodes 54a1 and 54a2 by wires, respectively. The long wavelength-blue LED element 44b is connected with the connecting electrodes 54b1 and 54b2 by wires, respectively. The long wavelength-blue LED element 44c is connected with the connecting electrodes 54c1 and 54c2 by wires, respectively. The long wavelength-blue LED element 44d is connected with the connecting electrodes 54d1 and 54d2 by wires, respectively.

In this way, upper surfaces of the red LED element 45 and the long wavelength-blue LED elements 44a, 44b, 44c and 44d are sealed as shown in the following.

That is to say, at least the red LED element 45 is sealed once by a half-transparent resin 52 made of epoxy containing a diffusing agent, upper surface of the half-transparent resin 52 sealing the red LED element 45 and the long wavelength-blue LED elements 44a, 44b, 44c and 44d are sealed by a sealing resinous member 50 containing the fluorescent material 8, as shown in FIGS. 4B and 4C. 51 is a resinous frame fixed in a peripheral portion on the substrate 41 to maintain a shape of the sealing resinous member 50. Red light sr similar to as in the first embodiment shown in FIGS. 1A to 1D is emitted from the red LED element 45, as shown in FIG. 4B, while the light is diffused by a diffusing agent which is not shown, in the half-transparent resin 52, and then scattered in any directions within the sealing resinous member 50. Long wavelength-blue lights sb1 similar as shown in FIGS. 1A to 1D are emitted from the long wavelength-blue LED elements 44a and 44b and so on, as shown in FIG. 4C, a portion of the lights sb1 is absorbed in the fluorescent material 8 and converted to yellow light sy.

In this way, the red light sr, the long wavelength-blue light sb1, and the yellow light sy are adequately mixed in the sealing resinous member 50 to make a color mixture, accordingly, the red light is prevented from being recognized into a point-like state from above. An operational principle and an effect of the white LED 40 according to the third embodiment structured as described above are basically the same as those of the white LED 20 according to the first embodiment as shown in FIG. 1, but, in addition, it is adapted to facilitate that the color rendering property is further improved, freedom degree of the emission chromaticity is increased, and the emission intensity from white light having no red color is improved, by disposing the four long wavelength-blue LED elements per one red LED element, hence for an increment of the number of the long wavelength-blue LED elements.

The white LED of the present invention relates to the fluorescent material-color mixing type white LED with the red complementary effect, but, it ensures the repeatability in the red range and can ensure fully an emission component in the vicinity of the wavelength of 500 nm in the green range, because the long wavelength-blue LED element in the range of 470 nm to 490 nm is used, in place of the conventional blue LED element in the range of 450 nm to 470 nm as the first LED element. Accordingly, the white LED of the present invention makes it possible to improve the color rendering property in the green range, compared with the conventional fluorescent material-color mixing type white LED with red complementary system as shown the patent document 3, and can use for a white point source used to a backlight of a full color display, with a sufficient color rendering property. Moreover, because the long wavelength-blue LED element may be substituted for the conventional blue LED element, merely, the structure of the LED may be simplified relatively without complicating, compared with the conventional white LEDs.

Because driving currents of the long wavelength-blue LED element which is the first LED element and the red LED element which is the second LED element can be controlled separately, a percentage of the emission intensity of the long wavelength-blue light and the emission intensity of the red light can be adjusted for any purpose, for example, if repeatability of a red range in photography and so on of a moving picture and a still picture is requested, a percentage of the emission intensity of the red light is increased, if illumination light close to natural light in place of a fluorescent bulb, the emission intensity from the long wavelength-blue LED element is increased so that red is not visible, to increase a percentage of the emission of the blue range and the emission of the fluorescent material excited by the emission of the blue range.

Moreover, by forming into a compact size the fluorescent material-mixing color type white LED with red complementary effect according to the present invention as a surface-mounted LED and/or using the reflecting means, the scattering of the illumination light is prevented and the illumination light can be collected efficiently to an illuminated object.

Moreover, it is possible to emit the LED elements and so on, used in the present invention, with desired wavelengths and to do selection of quality or cost.

Furthermore, the white LED can be structured so that it is small and appropriate for a surface mounting type even if separate terminals are provided relative to the plurality of LED elements, by use of the through-hole terminals.

In addition, the point-like red light is prevented from being recognized, because a part of above the red LED element is covered with a light shielding coat and the color mixture of the red light and other color lights is fully done before the mixed white light is emitted outside.

Although the preferred embodiments have been described, the present invention is not limited to these embodiments, various changes and modifications can be made for the embodiments.

What is claimed is:

1. A white light emitting diode for emitting illumination light comprising:
   a first light emitting diode element and a second light emitting diode element which have mutually different emission wavelengths; and
   a sealing member including a fluorescent material which is excited to emit yellow light and sealing the first light emitting diode element and the second light emitting diode element,
   the first light emitting diode element being a blue light emitting diode element having a peak wavelength of 470 nm to 490 nm,
   the second light emitting diode element being a red light emitting diode element for emitting red light, and
   a part above the red light emitting diode element being covered with a light shielding coat.

2. The white light emitting diode according to claim 1, wherein each of the first and second light emitting diode elements is electrically connected to independent terminals, respectively, and energization of the first and second light emitting diode elements is separately controlled.

3. The white light emitting diode according to claim 2, wherein the first light emitting diode element comprises a plurality of blue light emitting diode elements and the second light emitting diode element comprises one red light emitting diode element.

4. The white light emitting diode according to claim 3, wherein each of the plurality of blue light emitting diode elements is electrically connected to corresponding terminals respectively and energization thereof is separately controlled.

5. The white light emitting diode according to claim 1, wherein the first and second light emitting diode elements are mounted on a common board provided with conductive means corresponding to the first and second light emitting diode elements, respectively, and are sealed by the sealing member.

6. The white light emitting diode according to claim 5, wherein a reflecting member having a reflecting surface which is formed into a penetrating concave portion is attached to surround a periphery of the sealing member on the common board on which the first and second light emitting diode elements are mounted.

7. The white light emitting diode according to claim 1, wherein a peak wave length of the red light emitting diode element which is the second light emitting diode element has a range of 620 nm to 660 nm.

8. The white light emitting diode according to claim 1, wherein the blue light emitting diode element is of a GaN type.

9. The white light emitting diode according to claim 1, wherein the red light emitting diode element comprises GaAlAs or GaAlInP.

10. The white light emitting diode according to claim 1, wherein the fluorescent material is YAG.

11. The white light emitting diode according to claim 2, wherein at least one of the corresponding terminals comprises a through-hole electrode.

12. The white light emitting diode according to claim 1, wherein at least the red light emitting diode element is sealed by a half-transparent resin.

13. The light emitting diode according to claim 1, wherein the blue light emitting diode has a peak wavelength greater than 470 nm.

14. The light emitting diode according to claim 1, wherein the blue light emitting diode has a peak wavelength of 480 nm to 490 nm.

15. The light emitting diode according to claim 1, wherein the blue light emitting diode has a peak wavelength of 480 nm.

* * * * *